(12) United States Patent
Ko et al.

(10) Patent No.: US 12,451,418 B2
(45) Date of Patent: Oct. 21, 2025

(54) PRINTED CIRCUIT BOARD AND ELECTRONIC COMPONENT PACKAGE INCLUDING THE SAME

(71) Applicant: SAMSUNG ELECTRO-MECHANICS CO., LTD., Suwon-si (KR)

(72) Inventors: Young Kuk Ko, Suwon-si (KR); Chi Won Hwang, Suwon-si (KR); Sang Hoon Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 522 days.

(21) Appl. No.: 17/903,337

(22) Filed: Sep. 6, 2022

(65) Prior Publication Data

US 2023/0117940 A1    Apr. 20, 2023

(30) Foreign Application Priority Data

Oct. 19, 2021    (KR) .......................... 10-2021-0139073

(51) Int. Cl.
```
H01L 23/498    (2006.01)
H01L 21/48     (2006.01)
H01L 23/00     (2006.01)
```

(52) U.S. Cl.
CPC .... H01L 23/49838 (2013.01); H01L 21/4857 (2013.01); H01L 23/49816 (2013.01); H01L 23/49822 (2013.01); H01L 23/49833 (2013.01); H01L 24/16 (2013.01); *H01L 2224/16235* (2013.01); *H01L 2224/16237* (2013.01)

(58) Field of Classification Search
CPC .......... H01L 23/49838; H01L 21/4857; H01L 23/49816; H01L 23/49822; H01L 23/49833; H01L 24/16; H01L 2224/16235; H01L 2224/16237; H01L 24/81; H01L 23/13; H01L 23/12; H01L 23/481; H05K 1/115; H05K 3/107
See application file for complete search history.

(56) References Cited

U.S. PATENT DOCUMENTS 11,910,527 B2 *  2/2024  Kim .................... H01L 23/5389
2014/0021625 A1  1/2014  Nakamura et al.
(Continued)

FOREIGN PATENT DOCUMENTS

JP    2016-046519 A    4/2016
JP    2017-516308 A    6/2017
(Continued)

OTHER PUBLICATIONS

Office Action issued on Jul. 21, 2025 in the corresponding Korean Patent Application No. 10-2021-0139073 with English translation.

*Primary Examiner* — Douglas W Owens
(74) *Attorney, Agent, or Firm* — Morgan, Lewis & Bockius LLP

(57) ABSTRACT

A printed circuit board includes: a first insulating layer having at least one recess portion in one surface thereof; a first wiring layer embedded in one surface of the first insulating layer; and a first via layer including a first via penetrating through at least a portion of the first insulating layer, one surface of the first via being exposed externally through the recess portion.

19 Claims, 10 Drawing Sheets

(56) References Cited

U.S. PATENT DOCUMENTS

| | | |
|---|---|---|
| 2015/0016082 A1 | 1/2015 | Lee |
| 2016/0020163 A1* | 1/2016 | Shimizu .................. H05K 1/115 |
| | | 361/768 |
| 2016/0056102 A1 | 2/2016 | Konchady et al. |
| 2021/0068261 A1 | 3/2021 | Cho et al. |
| 2022/0262713 A1 | 8/2022 | Na et al. |
| 2023/0108464 A1* | 4/2023 | Jeong .................... H01L 23/552 |
| | | 257/659 |
| 2023/0215794 A1* | 7/2023 | Hong .................. H01L 21/4857 |
| | | 257/676 |
| 2023/0217593 A1* | 7/2023 | Nam ................. H01L 23/49827 |
| | | 361/761 |

FOREIGN PATENT DOCUMENTS

| | | |
|---|---|---|
| KR | 10-2014-0011946 A | 1/2014 |
| KR | 10-2015-0006686 A | 1/2015 |
| KR | 10-2021-0000105 A | 1/2021 |
| KR | 10-2021-0027002 A | 3/2021 |
| WO | 2015/175197 A1 | 11/2015 |

* cited by examiner

PRINTED CIRCUIT BOARD AND ELECTRONIC COMPONENT PACKAGE INCLUDING THE SAME

CROSS-REFERENCE TO RELATED APPLICATION(S)

This application claims benefit of priority to Korean Patent Application No. 10-2021-0139073 filed on Oct. 19, 2021 in the Korean Intellectual Property Office, the disclosure of which is incorporated herein by reference in its entirety.

TECHNICAL FIELD

The present disclosure relates to a printed circuit board and an electronic component package including the same.

BACKGROUND

With the recent implementation of high-functionality in electronic devices, the number of inputs/outputs (I/O) in an application processor (AP) and a memory is gradually increasing, and it is also continuously required to reduce a size of a package (PKG). The AP is being continuously developed in the form of a system-on-chip (SOC), and the AP has recently been expanded to have a function of a neural processing unit (NPU) or a 5G modem. Accordingly, there is a tendency toward an increase in size or thickness of an electronic component. Therefore, in order to reduce the size or thickness of the PKG, it is necessary to reduce a thickness of a substrate in a region on which an electronic component such as an AP is to be mounted.

As one way to reduce a thickness of a substrate, it may be considered to lower a height of an electrical connection metal to reduce a size or thickness of a package in a package-on-package (POP) structure. By reducing a thickness of an AP substrate in a region in which an electronic component is to be mounted or in a region in which an electrical connection metal is to be disposed, it is possible to achieve a fine pitch between electrical connection metal bumps, while reducing a thickness between the AP substrate and an interposer substrate.

SUMMARY

An aspect of the present disclosure may provide a printed circuit board advantageous in reduced overall thickness to reduce a size of a product, and an electronic component package including the same.

Another aspect of the present disclosure may provide a printed circuit board having a structure in which circuit patterns having a fine pitch therebetween are embedded in a top surface thereof on which electrical connection metal bumps are disposed, and an electronic component package including the same.

Another aspect of the present disclosure may provide a printed circuit board having a structure in which electrical connection metal bumps are disposed to have a fine pitch therebetween, and an electronic component package including the same.

According to an aspect of the present disclosure, a printed circuit board may include: a first insulating layer having at least one recess portion in one surface thereof; a first wiring layer embedded in the one surface of the first insulating layer; and a first via layer including a first via penetrating through at least a portion of the first insulating layer, one surface of the first via being exposed externally from a lower surface of the recess portion.

According to another aspect of the present disclosure, an electronic component package may include: a first substrate having first and second regions, and including a first insulating layer having a recess portion in one surface of the first region, and a first via layer including a first via penetrating through at least a portion of the first region, one surface of the first via being exposed externally from a lower surface of the recess portion; an electronic component disposed on the first region of the first insulating layer; and a second substrate disposed on one surface of the first substrate and the electronic component to be electrically connected to the first substrate.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

Figure 1:
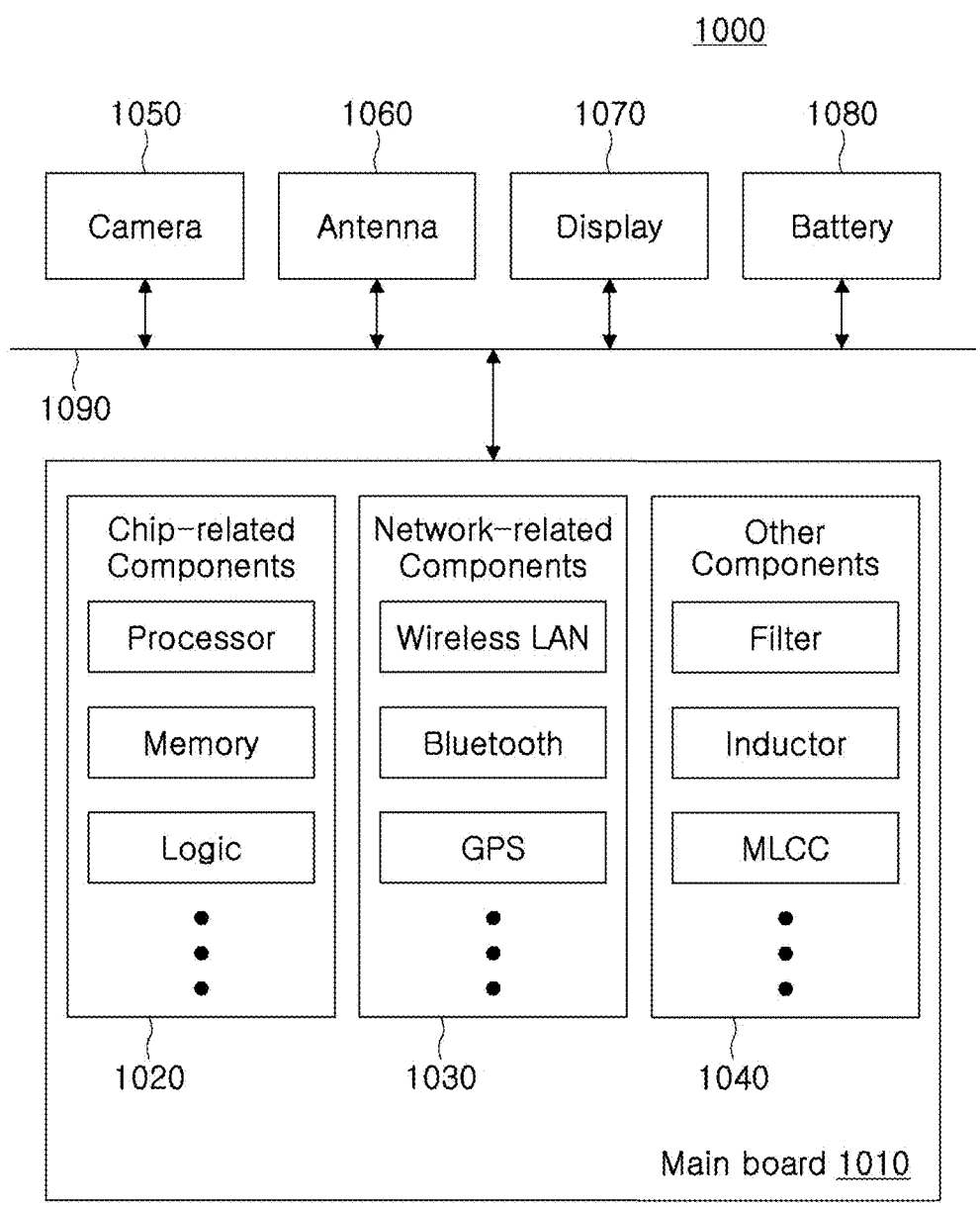
FIG. 1 is a block diagram schematically illustrating an example of an electronic device system.

FIG. 1 is a block diagram schematically illustrating an example of an electronic device system.

Referring to FIG. 1, an electronic device 1000 may accommodate a mainboard 1010 therein. The mainboard 1010 may include chip-related components 1020, network-related components 1030, and other components 1040, which are physically and/or electrically connected thereto. These components may be connected to other electronic components to be described below to form various signal lines 1090.

The chip-related components 1020 may include a memory chip such as a volatile memory (e.g., a dynamic random access memory (DRAM)), a non-volatile memory (e.g., a read only memory (ROM)), or a flash memory; an application processor chip such as a central processor (e.g., a central processing unit (CPU)), a graphics processor (e.g., a graphics processing unit (GPU)), a digital signal processor, a cryptographic processor, a microprocessor, or a microcontroller; and a logic chip such as an analog-digital converter (ADC) or an application-specific integrated circuit (ASIC). The chip-related components 1020 are not limited thereto, but may also include other types of chip-related components. In addition, these chip-related components may be combined with each other. The chip-related components 1020 may be in the form of a package including the chips described above.

The network-related components 1030 may include protocols such as wireless fidelity (Wi-Fi) (Institute of Electrical and Electronics Engineers (IEEE) 802.11 family or the like), worldwide interoperability for microwave access (WiMAX) (IEEE 802.16 family or the like), IEEE 802.20, long term evolution (LTE), evolution data only (Ev-DO), high speed packet access+(HSPA+), high speed downlink packet access+(HSDPA+), high speed uplink packet access+ (HSUPA+), global system for mobile communications (GSM), enhanced data GSM environment (EDGE), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network-related components 1030 are not limited thereto, but may also include a variety of other wireless or wired standards or protocols. In addition, the network-related components 1030 may be combined with the chip-related components 1020 to be provided in a package form.

The other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, the other components 1040 are not limited thereto, but also include passive elements in chip component type used for various other purposes, and the like. In addition, the other components 1040 may be combined with the chip-related components 1020 and/or the network-related components 1030 to be provided in a package form.

Depending on the type of electronic device 1000, the electronic device 1000 may include other electronic components that may or may not be physically and/or electrically connected to the mainboard 1010. Examples of the other electronic components may include a camera 1050, an antenna 1060, a display 1070, a battery 1080, and the like. The other electronic components are not limited thereto, but may be an audio codec, a video codec, a power amplifier, a compass, an accelerometer, a gyroscope, a speaker, a mass storage unit (e.g., a hard disk drive), a compact disk (CD), a digital versatile disk (DVD), and the like. The other electronic components may also include other electronic components and the like used for various purposes depending on the type of electronic device 1000.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
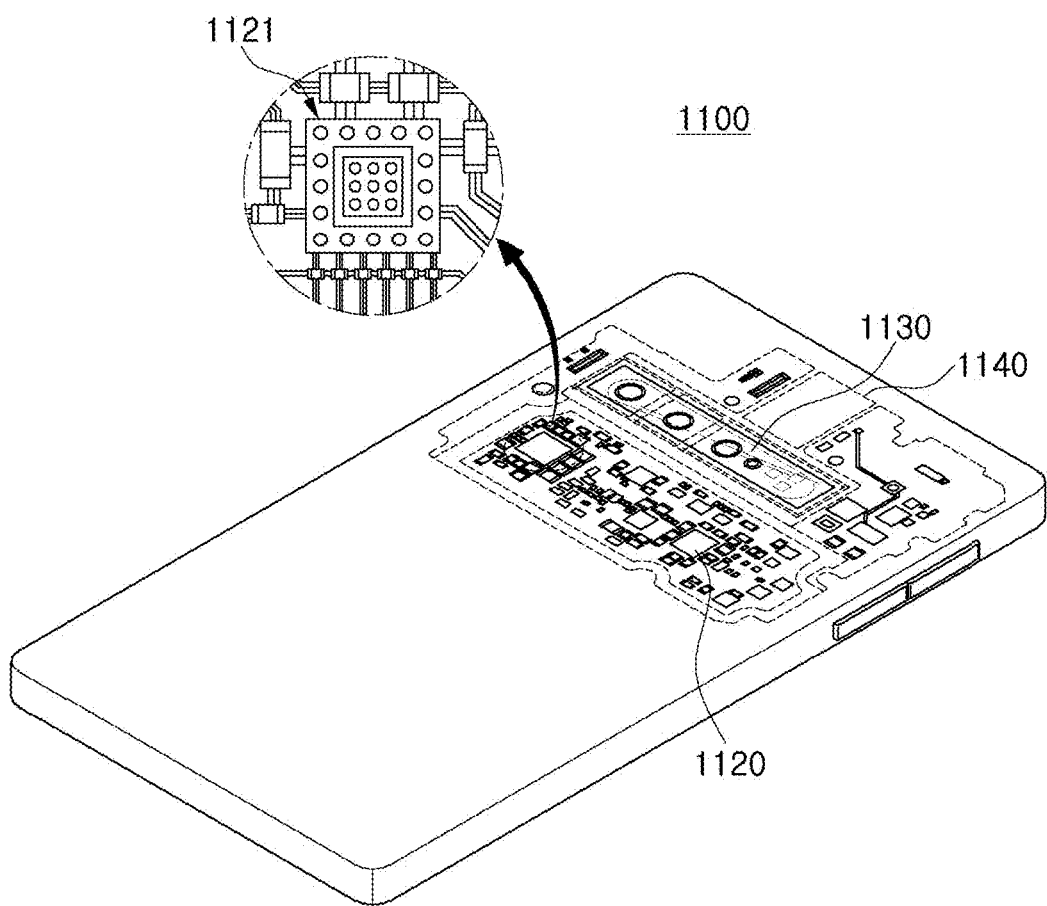
FIG. 2 is a perspective view schematically illustrating an exemplary embodiment of an electronic device.

FIG. 2 is a perspective view schematically illustrating an exemplary embodiment of an electronic device.

Referring to FIG. 2, the electronic device may be, for example, a smartphone 1100. A motherboard 1110 may be accommodated in the smartphone 1100, and various electronic components 1120 may be physically and/or electrically connected to the motherboard 1110. In addition, a camera module 1130, a speaker 1140, and/or the like may also be accommodated in the motherboard 1110. Some of the electronic components 1120 may be the above-described chip-related components, e.g., a printed circuit board 1121, but are not limited thereto. The printed circuit board 1121 may be in such a form that the electronic component is embedded in a multilayer printed circuit board, but is not limited thereto. Meanwhile, the electronic device is not necessarily limited to the smartphone 1100, but may be any other electronic device as described above.

Figure 3:
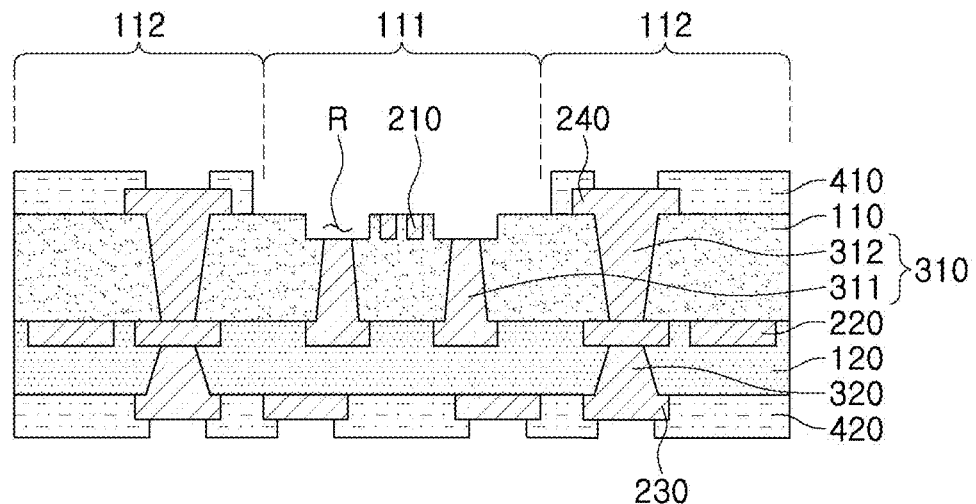
FIG. 3 is a cross-sectional view schematically illustrating an exemplary embodiment of a printed circuit board.

FIG. 3 is a cross-sectional view schematically illustrating an exemplary embodiment of a printed circuit board.

Referring to FIG. 3, a printed circuit board 100A1 according to an exemplary embodiment may include: a first insulating layer 110 having a plurality of recess portions R formed in one surface thereof; a first wiring layer 210 embedded in one surface of the first insulating layer 110; a second wiring layer 220 disposed on the other surface of the first insulating layer 110; a first via layer 310 including a first via 311 penetrating through at least a portion of the first insulating layer 110, connected to the second wiring layer 220, and exposed externally from a lower surface of each of at least some of the plurality of recess portions R; a second insulating layer 120 disposed on the other surface of the first insulating layer 110 to embed the second wiring layer 220 in one surface thereof; a third wiring layer 230 disposed on the other surface of the second insulating layer 120; a second via layer 320 penetrating through at least a portion of the second insulating layer 120 and electrically connecting the second and third wiring layers 220 and 230 to each other; a fourth wiring layer 240 disposed on one surface of the first insulating layer 110; and a second via 312 penetrating through at least a portion of the first insulating layer 110 and electrically connecting the second and fourth wiring layers 220 and 240 to each other.

For example, the printed circuit board 100A1 according to an exemplary embodiment may be an application processor (AP) substrate on which an electronic component is to be mounted later as will be described below. In the printed circuit board 100A1 according to an exemplary embodiment, the plurality of recess portions R may be formed in one surface of the first insulating layer 110, and the first vias 311 may be exposed externally from the lower surfaces of at least some of the plurality of recess portions R. That is, each of the plurality of recess portions R may not penetrate through the first insulating layer 110 entirely. In this case, when an electronic component is mounted on the printed circuit board 100A1 later, an overall thickness of the printed circuit board 100A1 with the electronic component mounted thereon can be further reduced as much as a depth of the recess portion R, which is advantageous in thickness reduction.

Meanwhile, the first wiring layer 210 may be embedded in one surface of the printed circuit board 100A1 according to an exemplary embodiment. The first wiring layer 210 may include a higher-density circuit than the second to fourth wiring layers 220 to 240. That is, the first wiring layer 210 may be formed as a fine circuit in which at least one of a line width and a pitch is smaller than those in the second to fourth wiring layers 220 to 240. In the printed circuit board 100A1 according to an exemplary embodiment, the first wiring layer 210 may be formed in an embedded form using a carrier 700 in a manufacturing process to be described below, thereby making it possible to easily implement a fine circuit.

Meanwhile, the first insulating layer 110 of the printed circuit board 100A1 according to an exemplary embodiment may include a first region 111 in which an electronic component 600 to be described below is to be mounted and a second region 112 surrounding the first region 111. The plurality of recess portions R formed in the first insulating layer 110 may be formed in the first region 111 of the first insulating layer 110, and specifically, may be formed in advance in the region where the electronic component 600 is to be mounted.

Meanwhile, the first vias 311 of the printed circuit board 100A1 according to an exemplary embodiment may be exposed externally from the lower surfaces of the plurality of recess portions R described above. Accordingly, the first vias 311 of the present disclosure may have a landless structure, and thus no separate lands may be disposed thereon. As a result, it is possible to prevent cracks or the like that usually occur between plating layers of vias and lands. In addition, 1-1st electrical connection metal bumps 511 to be described below may be disposed in the recess portions R for connection with the electronic component 600. As the first via 311 is directly connected to the electrical connection metal 511 without disposing a separate land thereon, it is possible to minimize the number of boundaries between a plurality of plating layers through which a signal needs to pass, thereby preventing damage to the signal and increasing reliability.

Meanwhile, the recess portion R of the printed circuit board 100A1 according to an exemplary embodiment may have a substantially equal cross-sectional area from an upper surface to a lower surface thereof, as compared to a typical opening in a passivation layer in which an electrical connection metal is placed. That is, a sidewall of the recess portion R may be substantially parallel to a thickness direction of the printed circuit board 100A1, thereby preventing a structural defect such as an undercut that occurs in a case where the sidewall is inclined.

Hereinafter, components of the printed circuit board 100A1 according to an exemplary embodiment will be described in more detail with reference to the drawings.

FIG. 3 is a cross-sectional view schematically illustrating an exemplary embodiment of a printed circuit board.

The plurality of insulating layers may include first and second insulating layers 110 and 120. In addition, the first insulating layer 110 may be divided into a first region 111, which is a region where an electronic component to be described below is to be mounted, and a second region 112, which is a peripheral region. The first and second insulating layers 110 and 120 may further improve the rigidity of the printed circuit board 100A1 depending on their specific materials. Meanwhile, the plurality of recess portions R may be formed in one surface of the first insulating layer 110. Each of the plurality of recess portions R may be a space of which all four sides are closed, but if necessary, may partially include a discontinuous section, e.g., a section exposed externally. The plurality of recess portions R may be disposed to be spaced apart from each other. An electrical connection metal 511 to be described below may be disposed in each of the plurality of recess portions R.

A material of the first and second insulating layers 110 and 120 may be an insulating material, for example, a thermosetting resin such as an epoxy resin or a thermoplastic resin such as a polyimide resin. Alternatively, the material of the insulating layer 100 may be a material including an inorganic filler such as silica and a reinforcing material such as a glass fiber together with the thermosetting or thermoplastic resin. For example, the material of the first and second insulating layers 110 and 120 may be prepreg, but is not limited thereto, and may be a material including no reinforcing material such as a glass fiber, e.g., an Ajinomoto build-up film (ABF). If necessary, the material of the first and second insulating layers 110 and 120 may be a photosensitive insulating material such as a photo imageable dielectric (PID).

Referring to FIG. 3, although it is illustrated herein that the plurality of insulating layers 110 and 120 include first and second insulating layers 110 and 120, the number of insulating layers may be greater or smaller than illustrated.

The plurality of recess portions R formed in one surface of the first insulating layer 110 may be formed by disposing and delaminating metal patterns N to be described below. Accordingly, each of the plurality of recess portions R may have a substantially equal cross-sectional area from the upper surface to the lower surface thereof. In the present disclosure, the term "substantially equal" may be interpreted as a range including an error such as a tolerance that may occur in the process. The plurality of recess portions R may be disposed in the first region 111 of the first insulating layer 110, causing an effect in reducing an overall thickness of a product when an electronic component is mounted later.

In addition, the first vias 311 may be exposed through the plurality of recess portions R for connection with an external component. In this case, unlike a typical opening in a solder resist or passivation layer enabling connection with an external component, the plurality of recess portions R may be formed in one surface of the first insulating layer 110 without having an interface between heterogeneous insulating layers, making it possible to prevent a problem of a delamination defect between heterogeneous insulating layers (e.g. an insulating layer and a solder resist layer) in advance.

In addition, when heterogeneous insulating layers having an opening therethrough are disposed at a position for connection with an external component, a crack may occur due to a defect such as an occurrence of an undercut in the opening. If an electrical connection metal paste or the like permeates into the crack, this may cause delamination between the heterogeneous insulating layers. Since the plurality of recess portions R of the present disclosure are formed in the first insulating layer 110, which is a single layer, rather than on the interface between the heterogeneous insulating layers, as described above, the problem of delamination between the insulating layers may be prevented.

The plurality of recess portions R may be formed by removing the metal patterns N to be described below, rather than through laser processing or mechanical processing. Thus, the inner walls and lower surfaces of the plurality of recess portions R may be formed to have a high roughness by roughening surfaces of the metal patterns N in a manufacturing process to be described below. For example, the inner walls and lower surfaces of the plurality of recess portions R may have a greater roughness than one surface of the first insulating layer 110. As the inner walls of the plurality of recess portions R are formed to have a relatively high roughness, when the electrical connection metal bumps 511 to be described below are disposed in the plurality of recess portions R, adhesion between the electrical connection metal bumps 511 and the plurality of recess portions R can be improved.

The plurality of wiring layers 210, 220, 230, and 240 may include first to fourth wiring layers 210 to 240, and may be disposed on or between the plurality of insulating layers 110 and 120 as components for transmitting signals of the printed circuit board 100A1.

The first wiring layer 210 may be embedded in one surface of the first insulating layer 110, and at least partially exposed externally of the first insulating layer 110. Referring to FIG. 3, the first wiring layer 210 may be exposed from one surface of the first insulating layer 110 toward the outside. Although not illustrated, as compared to one surface of the first insulating layer 110, an exposed surface of the first wiring layer 210 may be recessed by a predetermined distance (recess depth) inward of the printed circuit board 100A1 because of the characteristics of the etching process. Although not illustrated, a surface treatment layer including at least one of nickel (Ni) and gold (Au) or an organic film formed through surface treatment such as organic solderability preservative (OSP) may be disposed on the surface of the first wiring layer 210 exposed from one surface of the first insulating layer 110 to protect the surface of the first wiring layer 210 from oxidation.

The second wiring layer 220 may be disposed on the other surface of the first insulating layer 110 and at least partially embedded by the second insulating layer 120, the third wiring layer 230 may be disposed to protrude from the other surface of the second insulating layer 120, and the fourth wiring layer 240 may be disposed to protrude from one surface of the first insulating layer 110.

Meanwhile, the first wiring layer 210 may include a fine circuit for a high-density circuit as compared to the second to fourth wiring layers 220 to 240. In the present disclosure, the meaning of the fine circuit may be relative. That is, the meaning of the fine circuit may correspond to at least one of a case where wirings in the first wiring layer 210 have a smaller line width than wirings in the second to fourth wiring layers 220 to 240, a case where wirings in the first wiring layer 210 have a smaller pitch therebetween than wirings in the second to fourth wiring layers 220 to 240, and a case where wirings in the first wiring layer 210 have a smaller spacing therebetween than wirings in the second to fourth wiring layers 220 to 240. The meanings of the line width, the pitch, and the spacing will be described below.

In the present disclosure, the line width may refer to a width of a conductor pattern in a direction orthogonal to a direction in which the conductor pattern extends from one pad and/or land to another pad and/or land in each wiring layer.

In the present disclosure, the pitch may refer to a distance from the center of one conductor pattern to the center of another adjacent conductor pattern in each wiring layer.

In the present disclosure, the spacing may refer to an average value of shortest distances between adjacent wirings disposed in each wiring layer.

Meanwhile, on one surface of the first insulating layer 110, the first wiring layer 210 including a fine circuit may be disposed to be embedded from one surface of the first insulating layer 110, and the fourth wiring layer 240 may be disposed to protrude from one surface of the first insulating layer 110. Also, the first wiring layer 210 may be disposed in the first region 111 of the first insulating layer 110, and the fourth wiring layer 240 may be disposed in the second region 112 of the first insulating layer 110. That is, in the printed circuit board 100A1 according to an exemplary embodiment, at least one of a line width, a pitch, and a spacing in the wiring layer 210 disposed in the first region 111 of the first insulating layer 110 may be smaller than that in the wiring layer 240 disposed in the second region 112 of the first insulating layer 110.

A material of the first to fourth wiring layers 210 to 240 may be a metal material, for example, copper (Cu), aluminum (Al), silver (Ag), tin (Sn), gold (Au), nickel (Ni), lead (Pb), titanium (Ti), or an alloy thereof. The first to fourth wiring layers 210 to 240 may perform various functions depending on design. For example, the first to fourth wiring layers 210 to 240 may include ground patterns, power patterns, signal patterns, and the like. Each of these patterns may be in the form of a line, a plane, or a pad. Each of the first to fourth wiring layers 210 to 240 may be formed through a plating process such as an additive process (AP), a semi AP (SAP), a modified SAP (MSAP), or tenting (TT), and may resultantly include a seed layer, which is an electroless plating layer, and an electrolytic plating layer formed based on the seed layer. In a case where the insulating layers 110 and 120 are provided in the form of resin coated copper (RCC), each of the first to fourth wiring layers 210 to 240 may further include a metal foil such as a copper foil, and a primer resin may exist on a surface of the metal foil if necessary. Among the first to fourth wiring layers 210 to 240, a wiring layer exposed to the outermost layer may function as a connection pad for connection with another substrate or component. For example, the first, third, and fourth wiring layers 210, 230, and 240 exposed from the outermost layers of the printed circuit board 100A1 of FIG. 3 may be connected to the electrical connection metal bumps to be described below to function as connection pads.

Referring to FIG. 3, although only the first to fourth wiring layers 210 to 240 are illustrated herein, the number of wiring layers may be larger or smaller than what is illustrated.

The plurality of via layers 310 and 320 may include first and second via layers 310 and 320. The plurality of via layers 310 and 320 may include a first via layer 310 penetrating through the first insulating layer 110, and a second via layer 310 penetrating through the second insulating layer 120 and electrically connecting the second and third wiring layers 220 and 230 to each other. In addition, the first via layer 310 may include a first via 311 having one end exposed externally from the lower surface of the recess portion R and the other end connected in contact with the second wiring layer 220, and a second via 312 having one end connected in contact with the fourth wiring layer 240 and the other end connected in contact with the second wiring layer 220.

The first via 311 may be disposed such that one surface thereof is exposed from the lower surface of each of the plurality of recess portions R. The exposed one surface of the first via 311 may be connected in contact with an electrical connection metal to be described below. Meanwhile, the exposed one surface of the first via 311 may have an area and a width smaller than those of each of the plurality of recess portions R in a horizontal direction.

Meanwhile, the first and second vias 311 and 312 may be tapered in opposite directions according to manufacturing processes to be described below. Specifically, the first via 311 may be tapered to have a smaller cross-sectional area or width toward one end thereof exposed to the lower surface of the recess portion R from the other end thereof contacting the second wiring layer 220, and the second via 312 may be tapered to have a smaller cross-sectional area or width from one end thereof contacting the fourth wiring layer 240 toward the other end thereof contacting the second wiring layer 220. A height of the first via measured along a stacking direction may be different from a height of the second via and may be shorter than the height of the second via. The heights may be measured by for example, an optical microscope or a scanning electron microscope (SEM).

A material of the first and second via layers 310 and 320 may be a metal material, for example, copper (Cu), aluminum (Al), silver (Ag), tin (Sn), gold (Au), nickel (Ni), lead (Pb), titanium (Ti), or an alloy thereof. The first and second via layers 310 and 320 may include signal vias, ground vias, power vias, and the like depending on design. Each of the vias of the first and second via layers 310 and 320 may be formed by completely filling a via hole with the metal material, or may be formed by placing the metal material along a wall of the via hole. The first and second via layers 310 and 320 may also be formed through a plating process such as AP, SAP, MSAP, or TT, and may include a seed layer, which is an electroless plating layer, and an electrolytic plating layer formed based on the seed layer. Each of the vias of the first and second via layers 310 and 320 may have a tapered shape in which an upper surface thereof has a larger width than a lower surface thereof.

Meanwhile, although only the first and second via layers 310 and 320 are illustrated in FIG. 3, more or fewer via layers may be disposed if necessary.

First and second passivation layers 410 and 420 may protect internal components from external physical and chemical damage or the like. The first and second passivation layers 410 and 420 may have a plurality of first and second openings, respectively. Each of the plurality of first openings may expose at least a portion of the first wiring layer 210, at least some of the plurality of recess portions R, or at least a portion of the fourth wiring layer 240. Each of the plurality of second openings may expose at least a portion of the third wiring layer 230. A material of the first and second passivation layers 410 and 420 may be an insulating material, for example, a thermosetting resin such as an epoxy resin, a thermoplastic resin such as a polyimide resin, or a material in which the thermosetting or thermoplastic resin is mixed with an inorganic filler, e.g., an ABF, but is not limited thereto.

Meanwhile, although not illustrated, the first passivation layer 410 may cover the first wiring layer 210 embedded in one surface of the first insulating layer 110. In this case, an unnecessary short circuit between the electrical connection metal to be described below and the first wiring layer 210 can be prevented, and an additional step can be generated on the recess portion R where the electrical connection metal is to be disposed, making it possible to secure the adhesion of the electrical connection metal.

Figure 4:
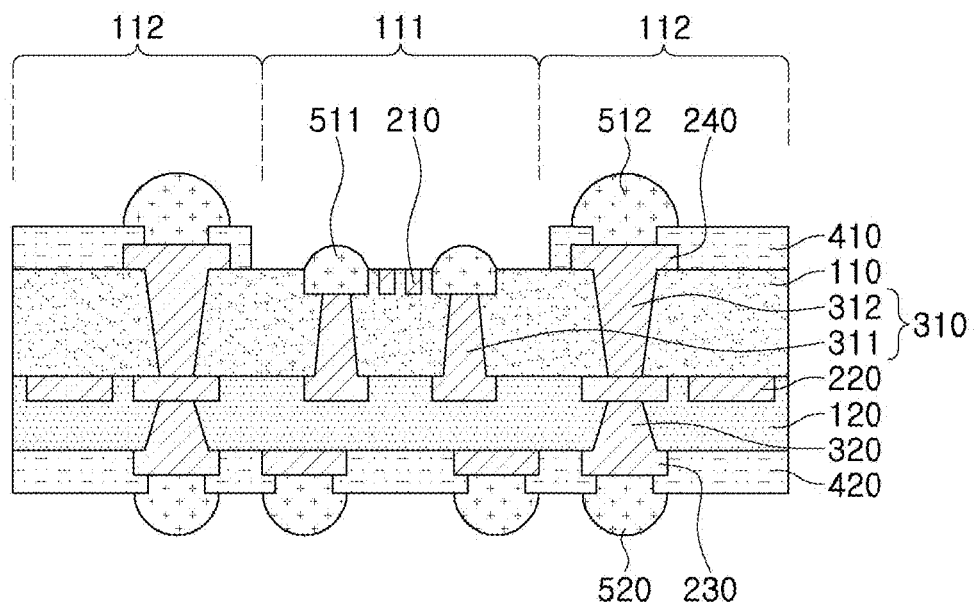
FIG. 4 is a cross-sectional view schematically illustrating a modified exemplary embodiment of the printed circuit board of FIG. 3.

FIG. 4 is a cross-sectional view schematically illustrating a modified exemplary embodiment of the printed circuit board of FIG. 3.

A printed circuit board 100A2 according to a modified exemplary embodiment of FIG. 4 is different from the printed circuit board 100A1 according to an exemplary embodiment in that first and second electrical connection metal bumps 510 and 520 may additionally be disposed. In the following description, only components of the printed circuit board 100A2 different from those of the printed circuit board 100A1 according to an exemplary embodiment will be described, and what has been described above about the printed circuit board 100A1 is identically applicable to the overlapping components.

In the printed circuit board 100A2 according to a modified exemplary embodiment, electrical connection metal bumps 511, 512, and 520 may be disposed in the first openings of the first passivation layer 410, the second openings of the second passivation layer 420, and the plurality of recess portions R, respectively.

The first electrical connection metal bumps 510 may include 1-1st electrical connection metal bumps 511 and 1-2nd electrical connection metal bumps 512. The 1-1st electrical connection metal bumps 511 may be disposed in the plurality of recess portions R to be connected in contact with the first vias 311 described above, respectively, and the 1-2nd electrical connection metal bumps 512 may be disposed on the fourth wiring layer 240 exposed through the first openings. That is, the 1-1st electrical connection metal bumps 511 may refer to electrical connection metal bumps disposed in the first region 111 of the first insulating layer 110, and the 1-2nd electrical connection metal bumps 512 may refer to electrical connection metal bumps disposed in the second region 112 of the first insulating layer 110.

The second electrical connection metal bumps 520 may be disposed on the third wiring layer 230 exposed through the second openings of the second passivation layer 420.

The first and second electrical connection metal bumps 510 and 520 may physically and/or electrically connect the printed circuit board 100A2 to the outside. For example, the 1-1st electrical connection metal bumps 511 may electrically connect the exposed first vias 311 to another external component, e.g., an electronic component 600 to be described below, the 1-2nd electrical connection metal bumps 512 may connect the fourth wiring layer 240 to another external component, and the second electrical connection metal bumps 520 may electrically connect the exposed third wiring layer 230 to another external component. Each of the first and second electrical connection metal bumps 510 and 520 may be formed of tin (Sn) or an alloy containing tin (Sn), e.g., a solder, but is not limited thereto. Each of the first and second electrical connection metal bumps 510 and 520 may be a metal post or the like in the form of a land, a ball, a pin, or a column.

Figure 5:
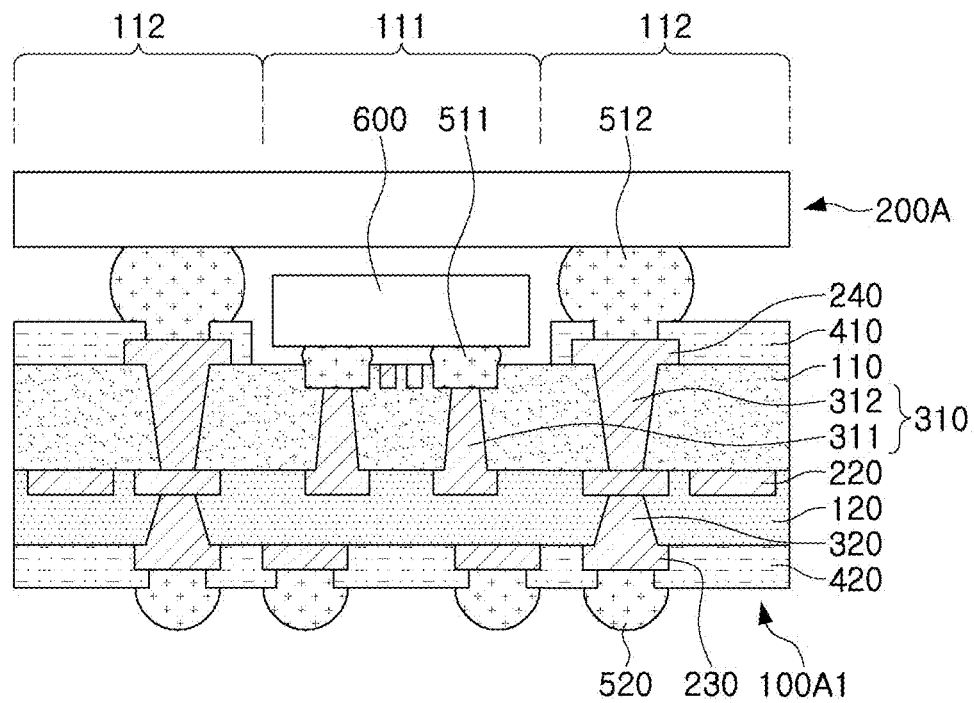
FIG. 5 is a cross-sectional view schematically illustrating an electronic component package according to an exemplary embodiment including the printed circuit board of FIG. 3.

FIG. 5 is a cross-sectional view schematically illustrating an electronic component package according to an exemplary embodiment including the printed circuit board of FIG. 3.

An electronic component package 100A3 of FIG. 5 is different from the printed circuit board 100A1 according to an exemplary embodiment in that first and second electrical connection metal bumps 510 and 520, an electronic component 600, and a second substrate 200A may additionally be disposed. In the following description, only components added in the electronic component package 100A3 as compared to the printed circuit board 100A1 according to an exemplary embodiment will be described, and what has been described above about the printed circuit board 100A1 is identically applicable to the overlapping components.

In the description of the electronic component package 100A3, the above-described printed circuit board 100A1 according to an exemplary embodiment may be referred to as a first substrate 100A1. The electronic component package 100A3 may include a first substrate 100A1, an electronic component 600 mounted on one surface of the first substrate 100A1, and a second substrate 200A mounted on one surface of the first substrate 100A1. Also, the first region 111 of the first insulating layer 110 described above may refer to a region in which the electronic component 600 is mounted.

Concerning the first and second electrical connection metal bumps 510 and 520 described above, what has been described above about the printed circuit board 100A2 according to a modified exemplary embodiment may be identically applicable.

The electronic component 600 may be an integrated circuit (IC) die in which hundreds to millions of devices are integrated in a single chip. For example, the electronic component 600 may be, for example, a processor chip such as a central processor (e.g., a CPU), a graphic processor (e.g., a GPU), a field programmable gate array (FPGA), a digital signal processor, a cryptographic processor, a micro processor, or a micro controller, specifically an application processor (AP), but is not limited thereto. In addition, the electronic component 600 may be a memory such as a volatile memory (e.g., a DRAM), a non-volatile memory (e.g., a ROM), or a flash memory, or a logic such as an analog-to-digital converter or an application-specific IC (ASIC). If necessary, the electronic component 600 may be a chip-type passive component, e.g., a chip-type capacitor such as a multilayer ceramic capacitor (MLCC) or a chip-type inductor such as a power inductor (PI). The electronic component 600 may be disposed so that a surface thereof on which connection pads (not illustrated) are disposed faces downward, and an opposite surface thereof faces upward. The connection pads of the electronic component 600 may include a metal material such as copper (Cu) or aluminum (Al), and may be connected to the 1-1st electrical connection metal bumps 511. The electronic component 600 may be covered by an encapsulant (not illustrated) without a separate adhesive film, and resultantly, a back surface and side surfaces of the electronic component 600 may be in physical contact with the encapsulant (not illustrated).

Referring to FIG. 5, the electronic component 600 may be mounted in the first region 111 of the first insulating layer 110 of the first substrate 100A1. In addition, since the electronic component 600 is mounted through the 1-1st electrical connection metal bumps 511, and the 1-1st electrical connection metal bumps 511 are disposed in the recess portions R recessed from one surface of the first insulating layer 110, not on one surface of the first insulating layer 110, a thickness can be reduced as much as a depth of the recess portions R, thereby making the electronic component package 100A3 thin. The electronic component 600 may be electrically connected to the first vias 311 through the 1-1st electrical connection metal bumps 511. In this case, the first via 311 may be directly connected to the 1-1st electrical connection metal 511 without disposing a separate land or pad on one surface of the first via 311, and as a result, it is possible to reduce the number of interfaces between plating layers, thereby preventing a defect in transmitting a signal in advance.

Meanwhile, the second substrate 200A may be a substrate including a plurality of insulating layers, a plurality of wiring layers, and a plurality of via layers, for example, an interposer substrate. The second substrate 200A may be electrically connected to the 1-2nd electrical connection metal bumps 512, and mounted on one surface of the first substrate 100A1.

In this case, the 1-2nd electrical connection metal bumps 512 may be disposed in the second region 112 of the first insulating layer 110 to electrically connect the fourth wiring layer 240 of the first substrate 100A1 to the second substrate 200A.

Concerning the other overlapping components, what has been described above about the printed circuit board 100A1 according to an exemplary embodiment is identically applicable.

Figure 6:
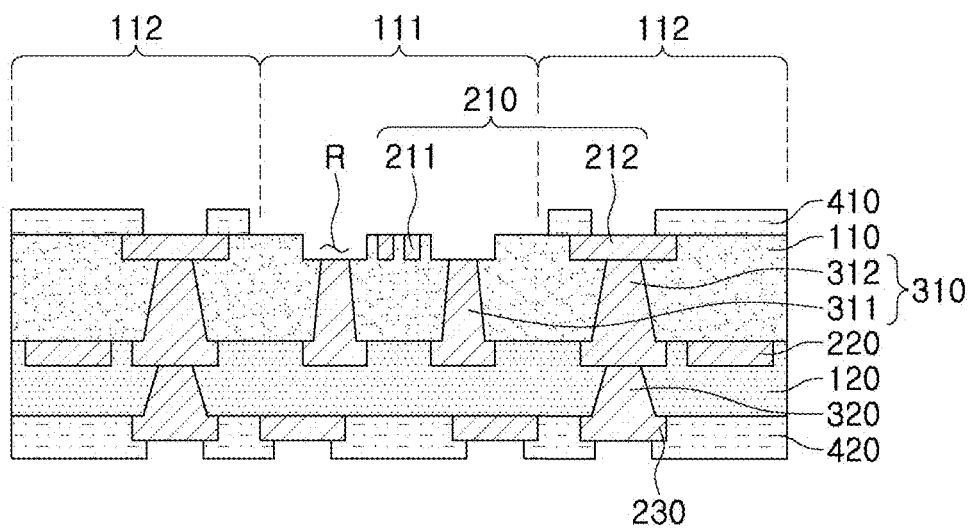
FIG. 6 is a cross-sectional view schematically illustrating another exemplary embodiment of a printed circuit board.

FIG. 6 is a cross-sectional view schematically illustrating another exemplary embodiment of a printed circuit board.

A printed circuit board 100B1 according to another exemplary embodiment of FIG. 6 is different from the printed circuit board 100A1 according to an exemplary embodiment in that the first wiring layer 210 includes first circuit patterns 211 and second circuit patterns, at least one of a line width and a pitch of the second circuit patterns being larger than that of the first circuit patterns 211, the wiring layer disposed on one surface of the first insulating layer 110 is entirely embedded from one surface of the first insulating layer 110, and the first and second vias 311 and 312 are tapered in the same direction. In the following description, only components of the printed circuit board 100B1 different from those of the printed circuit board 100A1 according to an exemplary embodiment will be described, and what has been described above about the printed circuit board 100A1 is identically applicable to the overlapping components.

The first wiring layer 210 may include first circuit patterns 211 disposed in the first region 111 of the first insulating layer 110 and second circuit patterns 212 disposed in the second region 112 of the first insulating layer 110. In this case, at least one of a line width and a pitch of the second circuit patterns 212 may be larger than that of the first circuit patterns 211. The first circuit patterns 211 may include a fine circuit, and the fine circuit may have a relative meaning, indicating a structure in which at least one of a line width, a pitch, and a spacing for the first circuit patterns 211 is smaller than that for the second circuit patterns 212. Concerning the line width, the pitch, and the spacing, what has been described above about the printed circuit board 100A1 according to an exemplary embodiment may be identically applicable.

Since the first wiring layer 210 is embedded in the first insulating layer 110, each of the first and second circuit patterns 211 and 212 may also be disposed to be embedded from one surface of the first insulating layer 110. The second circuit pattern 212 may be electrically connected to the second wiring layer 220 through the second via 312, and at least a portion of one surface of the second circuit pattern 212 may be exposed through the first opening of the first passivation layer 410.

In the printed circuit board 100B1 according to another exemplary embodiment, since there is no wiring layer disposed to protrude from one surface of the first insulating layer 110, an overall thickness of the printed circuit board 100B1 can be further reduced when compared to that of the printed circuit board 100A1 according to an exemplary embodiment.

Meanwhile, in the printed circuit board 100B1 according to another exemplary embodiment, the first and second vias 311 and 312 constituting the first via layer 310 may be tapered in the same direction. That is, the first via 311 may be tapered to have a smaller cross-sectional area or width toward one end thereof exposed to the lower surface of the recess portion R from the other end thereof contacting the second wiring layer 220, and the second via 312 may also be tapered to have a smaller cross-sectional area or width toward one end thereof contacting the second circuit pattern 212 from the other end thereof contacting the second wiring layer 220.

Meanwhile, in the printed circuit board 100B1 according to another exemplary embodiment, since there is no need to separately form a wiring layer protruding from one surface of the first insulating layer 110, the process can be simplified and the cost can be reduced, when compared to those of the printed circuit board 100A1 according to an exemplary embodiment.

Concerning the other overlapping components, what has been described above about the printed circuit board 100A1 according to an exemplary embodiment is identically applicable.

Figure 7:
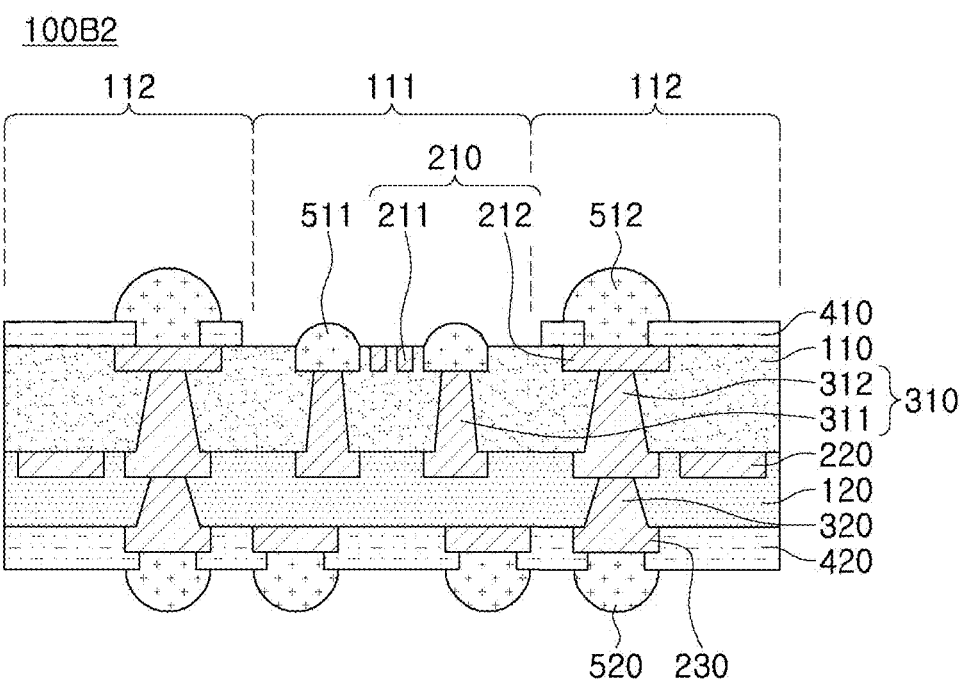
FIG. 7 is a cross-sectional view schematically illustrating a modified exemplary embodiment of the printed circuit board of FIG. 6.

FIG. 7 is a cross-sectional view schematically illustrating a modified exemplary embodiment of the printed circuit board of FIG. 6.

A printed circuit board 100B2 according to a modified exemplary embodiment of FIG. 7 is different from the printed circuit board 100B1 according to another exemplary embodiment in that first and second electrical connection metal bumps 510 and 520 may additionally be disposed. In the following description, only components of the printed circuit board 100B2 different from those of the printed circuit board 100B1 according to another exemplary embodiment will be described, and what has been described above about the printed circuit board 100B1 is identically applicable to the overlapping components.

In the printed circuit board 100B2 according to a modified exemplary embodiment, electrical connection metal bumps 511, 512, and 520 may be disposed in the first openings of the first passivation layer 410, the second openings of the second passivation layer 420, and the plurality of recess portions R, respectively.

The first electrical connection metal bumps 510 may include 1-1st electrical connection metal bumps 511 and 1-2nd electrical connection metal bumps 512. The 1-1st electrical connection metal bumps 511 may be disposed in the plurality of recess portions R to be electrically connected to the first vias 311, and the 1-2nd electrical connection metal bumps 512 may be disposed on the second circuit patterns 212 exposed through the first openings of the first passivation layer 410. The second electrical connection metal bumps 520 may be disposed on the third wiring layer 230 exposed through the second openings of the second passivation layer 420.

In the printed circuit board 100B2 according to a modified exemplary embodiment, since there is also no wiring layer disposed to protrude from one surface of the first insulating layer 110, and the first electrical connection metal bumps 510 are disposed on the embedded first wiring layer 210, an overall thickness of the printed circuit board 100B2 can be further reduced.

The first and second electrical connection metal bumps 510 and 520 may physically and/or electrically connect the printed circuit board 100B2 to the outside. For example, the 1-1st electrical connection metal bumps 511 may electrically connect the exposed first vias 311 to another external component, e.g., an electronic component 600 to be described below, the 1-2nd electrical connection metal bumps 512 may connect the second circuit patterns 212 to another external component, and the second electrical connection metal bumps 520 may electrically connect the exposed third wiring layer 230 to another external component. Each of the first and second electrical connection metal bumps 510 and 520 may be formed of tin (Sn) or an alloy containing tin (Sn), e.g., a solder, but is not limited thereto. Each of the first and second electrical connection metal bumps 510 and 520 may be a metal post or the like in the form of a land, a ball, a pin, or a column.

Concerning the other overlapping components, what has been described above about the printed circuit board 100B1 according to another exemplary embodiment is identically applicable.

Figure 8:
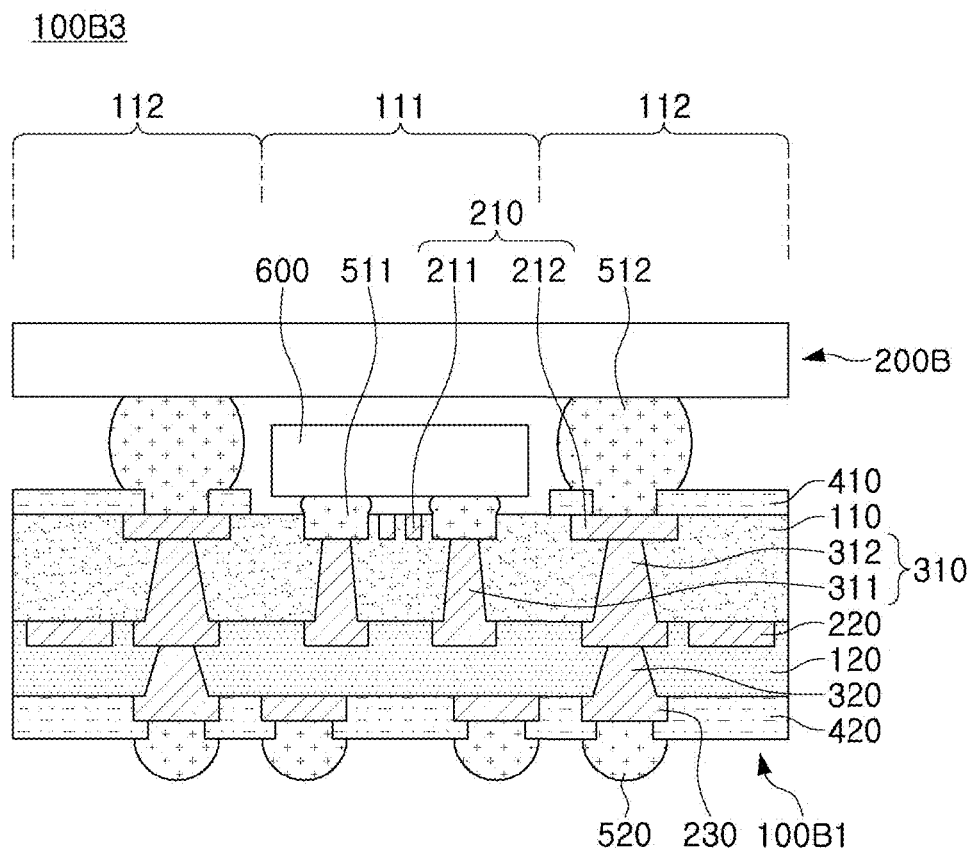
FIG. 8 is a cross-sectional view schematically illustrating an electronic component package according to another exemplary embodiment including the printed circuit board of FIG. 6.

FIG. 8 is a cross-sectional view schematically illustrating an electronic component package according to another exemplary embodiment including the printed circuit board of FIG. 6.

An electronic component package 100B3 of FIG. 8 is different from the electronic component package 100A3 according to exemplary embodiment of FIG. 5 in a structure of a first substrate 100B1. In the following description, only components of the electronic component package 100B3 different from those of the electronic component package 100A3 according to an exemplary embodiment will be described, and what has been described above about the electronic component package 100A3 is identically applicable to the overlapping components.

In the description of the electronic component package 100B3, the above-described printed circuit board 100B1 according to another exemplary embodiment may be referred to as a first substrate 100B1. The electronic component package 100B3 may include a first substrate 100B1, an electronic component 600 mounted on one surface of the first substrate 100B1, and a second substrate 200B mounted on one surface of the first substrate 100A1. Also, the first region 111 of the first insulating layer 110 described above may refer to a region in which the electronic component 600 is mounted.

Referring to the electronic component package 100B3 of FIG. 8, since the 1-1st electrical connection metal bumps 511 are disposed in the recess portions R of the first substrate 100B1, and the electronic component 600 is mounted on one surface of the first substrate 100B1 using the 1-1st electrical connection metal bumps 511, an overall thickness of the electronic component package 100B3 can be further reduced.

In addition, in the electronic component package 100B3 according to another exemplary embodiment, when compared to that of the electronic component package 100A3 according to an exemplary embodiment, there may be no wiring layer protruding from one surface of the first insulating layer 110, and the second circuit patterns 212 may be embedded from one surface of the first insulating layer 110. Thus, in the electronic component package 100B3 according to another exemplary embodiment, it is also possible to lower a height at which the second substrate 200B is disposed on the first substrate 100B1, which is advantageous in reducing an overall thickness of a product.

Concerning the second substrate 200B, what has been described above about the second substrate 200A of the electronic component package 100A3 according to an exemplary embodiment may be identically applicable.

Concerning the other overlapping components, what has been described above about the electronic component package 100A3 according to an exemplary embodiment is identically applicable.

FIGS. 9 to 13 are process cross-sectional views schematically illustrating an exemplary embodiment of a method for manufacturing the printed circuit board of FIG. 3.

Figure 9:
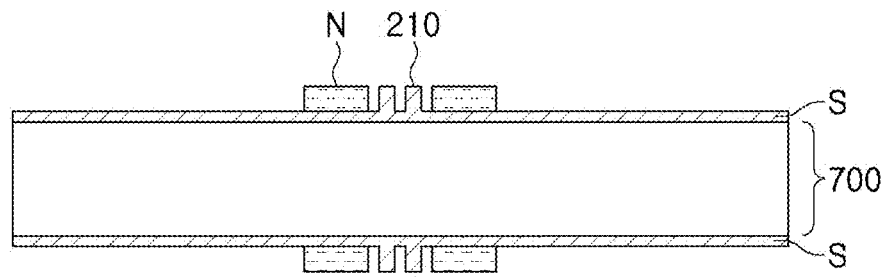
FIGS. 9 to 13 are process cross-sectional views schematically illustrating an exemplary embodiment of a method for manufacturing the printed circuit board of FIG. 3.

Referring to FIG. 9, a carrier 700 provided with seed layers S on both sides thereof may be prepared, and then, a first wiring layer 210 may be formed through plating and patterning processes. In addition, metal patterns N may be formed through additional plating and patterning processes. In this case, the first wiring layer 210 may include copper (Cu), and the metal patterns N may include nickel (Ni).

Meanwhile, the first wiring layer 210 and the metal patterns N may be roughened to secure adhesion thereof to an insulating layer, and the roughness thereof formed through the roughening process may be identically formed on the first insulating layer 110 contacting each of the first wiring layer 210 and the metal patterns N.

Figure 10:
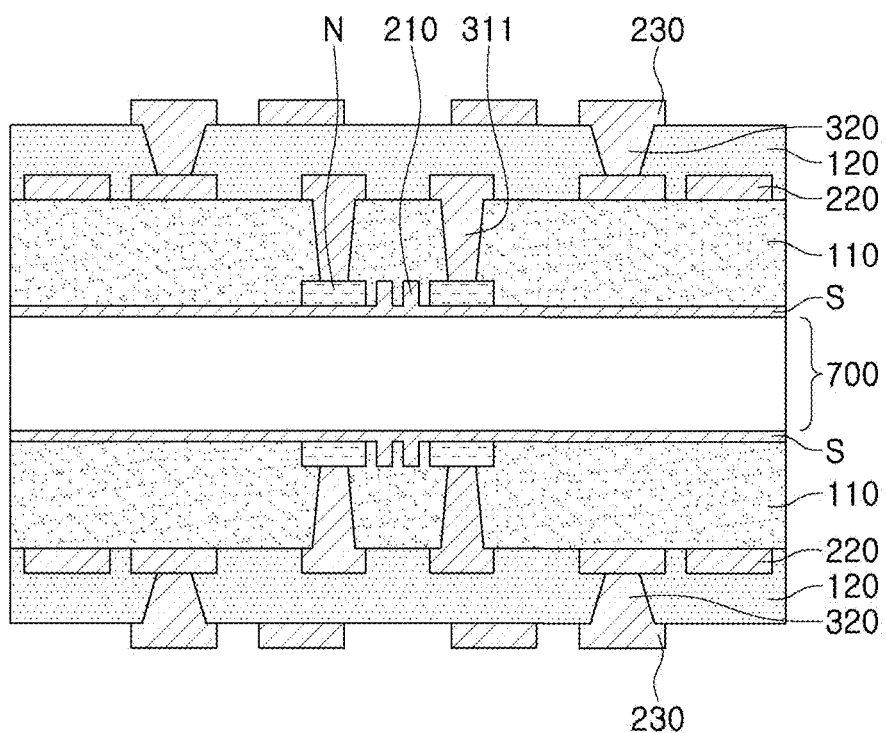

Referring to FIG. 10, first and second insulating layers 110 and 120, second and third wiring layers 220 and 230, a first via 311, and a second via layer 320 may be disposed through respective build-up processes.

Figure 11:
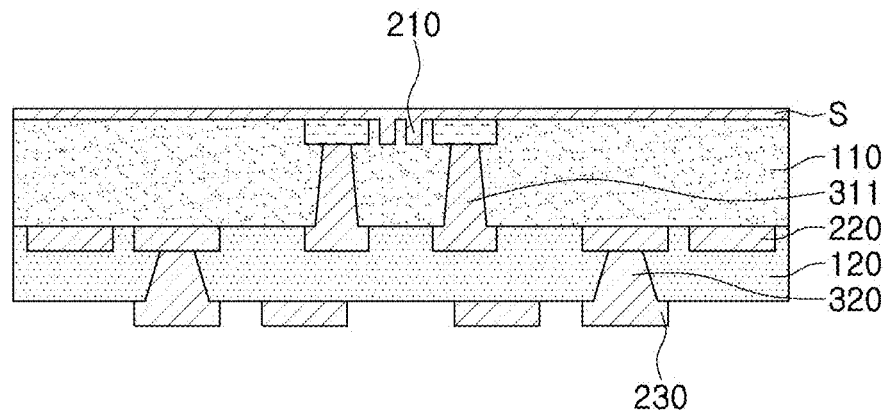
Figure 12:
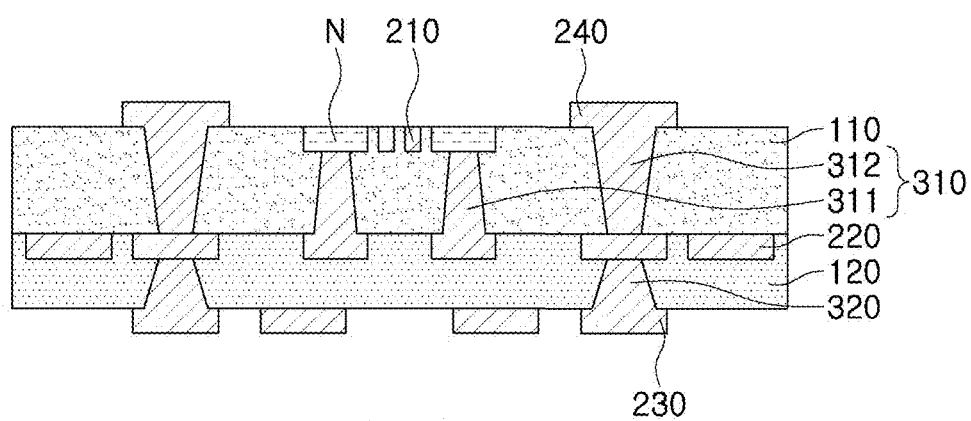

Referring to FIGS. 11 and 12, by performing additional plating and patterning processes and removing the seed layer S after separating a precursor of a printed circuit board from the carrier 700, a fourth wiring layer 240 may be disposed on one surface of the first insulating layer 110, and simultaneously, a second via 312 penetrating through at least a portion of the first insulating layer 110 may be formed. The second via 312 may electrically connect the second wiring layer 220 and the fourth wiring layer 240 to each other. In this case, the fourth wiring layer 240 may include copper (Cu).

Figure 13:
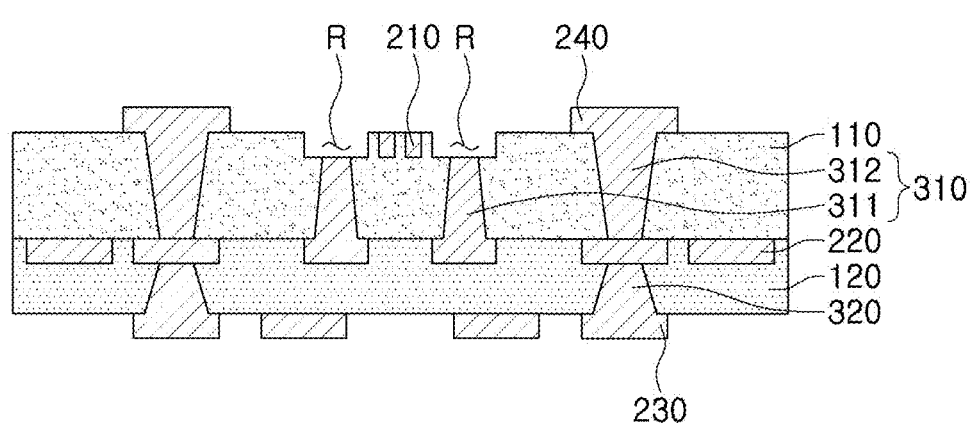

Referring to FIG. 13, the metal patterns N including nickel may be removed to form a plurality of recess portions R. In this case, since the metal patterns N include nickel, an etching process may be performed using an etchant that selectively reacts with the nickel (Ni) metal. Since one surface of the first insulating layer 110 is etched using the etchant that reacts with the nickel metal, the metal patterns N can be effectively removed without damaging the first and fourth wiring layers 210 and 240 disposed on one surface of the first insulating layer 110, as a result manufacturing the printed circuit board 100A1 of FIG. 3.

FIGS. 14 to 17 are process cross-sectional views schematically illustrating an exemplary embodiment of a method for manufacturing the printed circuit board of FIG. 6.

Figure 14:
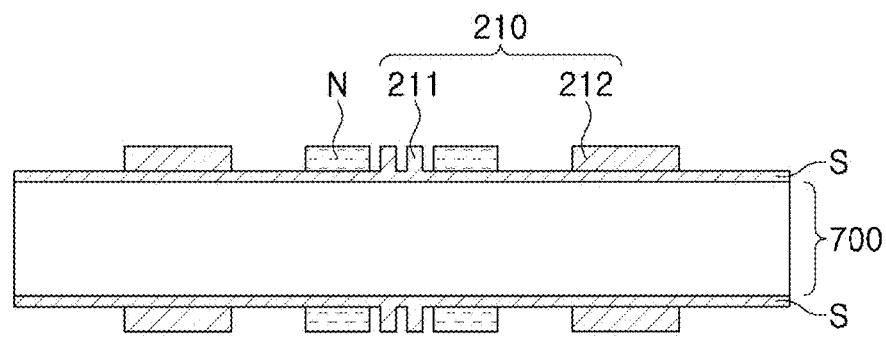
FIGS. 14 to 17 are process cross-sectional views schematically illustrating an exemplary embodiment of a method for manufacturing the printed circuit board of FIG. 6.

Referring to FIG. 14, a carrier 700 provided with seed layers S on both sides thereof may be prepared, and then, a first wiring layer 210 may be formed through plating and patterning processes. The first wiring layer 210 may include a first circuit pattern 211 and a second circuit pattern 212. In addition, metal patterns N may be formed through additional plating and patterning processes. In this case, the first and second circuit patterns 211 and 212 may include copper (Cu), and the metal patterns N may include nickel (Ni).

Figure 15:
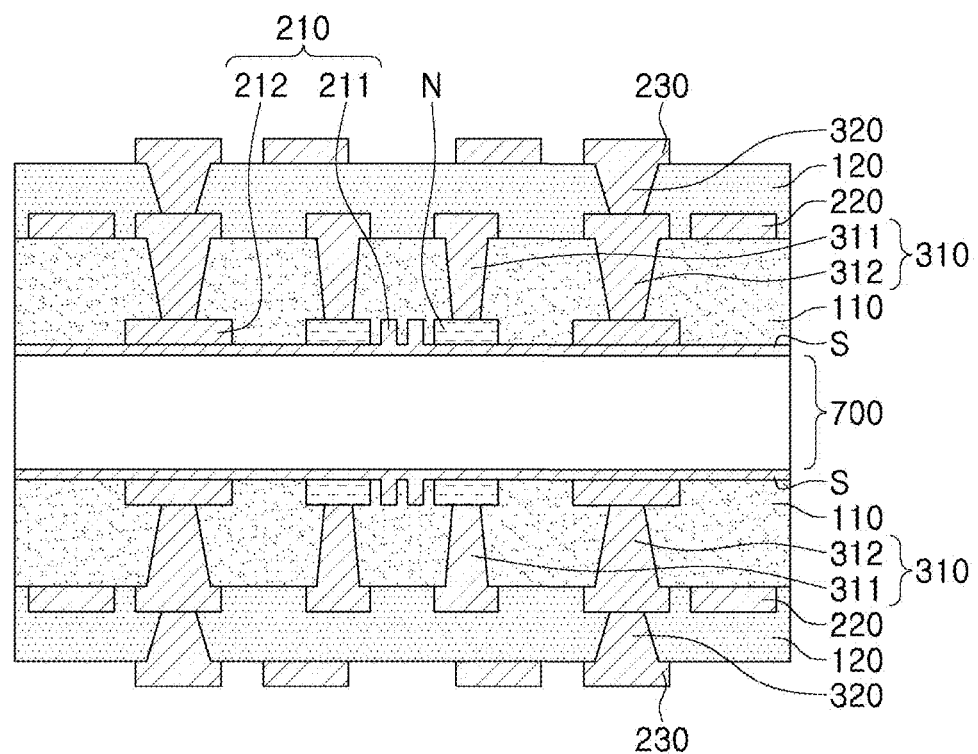

Referring to FIG. 15, first and second insulating layers 110 and 120, second and third wiring layers 220 and 230, and first and second via layers 310 and 320 may be disposed through respective build-up processes.

Figure 16:
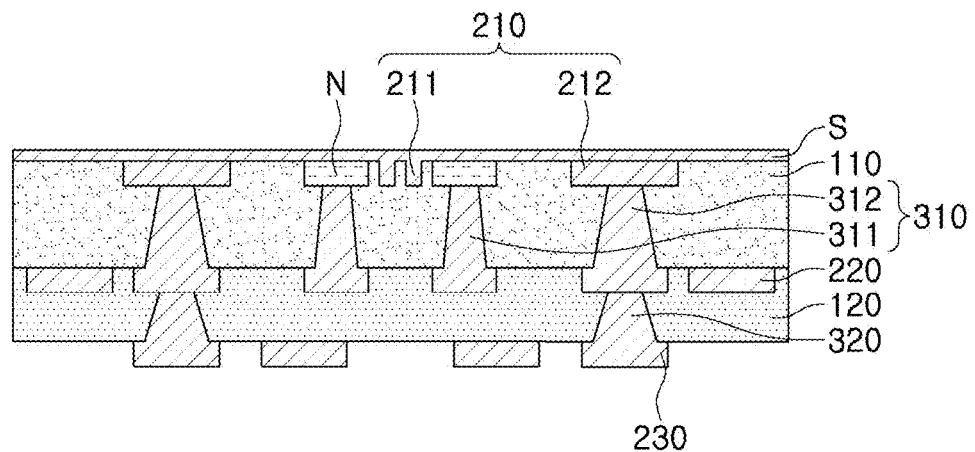
Figure 17:
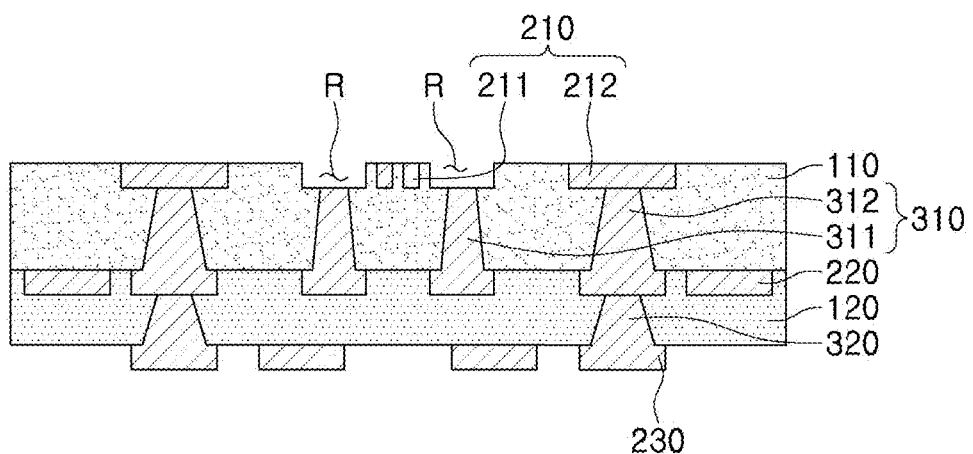

Referring to FIGS. 16 and 17, by removing the seed layer S through an additional etching process after separating a precursor of a printed circuit board from the carrier 700, the first wiring layer 210 and the metal patterns N may be exposed from one surface of the first insulating layer 110. Thereafter, the metal patterns N including nickel may be removed to form a plurality of recess portions R. In this case, since the metal patterns N include nickel, an etching process may be performed using an etchant that selectively reacts with the nickel (Ni) metal. Since one surface of the first insulating layer 110 is etched using the etchant that reacts with the nickel metal, the metal patterns N can be effectively removed without damaging the first wiring layer 210 disposed on one surface of the first insulating layer 110, as a result manufacturing the printed circuit board 100B1 of FIG. 6.

As set forth above, as one effect of the present disclosure, it is possible to provide a printed circuit board advantageous in reducing its overall thickness to reduce a size of a product, and an electronic component package including the same.

As another effect of the present disclosure, it is possible to provide a printed circuit board having a structure in which circuit patterns having a fine pitch therebetween are embedded in a top surface thereof on which electrical connection metal bumps are disposed, and an electronic component package including the same.

As another effect of the present disclosure, it is possible to provide a printed circuit board having a structure in which electrical connection metal bumps are disposed to have a fine pitch therebetween, and an electronic component package including the same.

While exemplary embodiments have been shown and described above, it will be apparent to those skilled in the art that modifications and variations could be made without departing from the scope of the present invention as defined by the appended claims.

What is claimed is:

1. A printed circuit board comprising:
   a first insulating layer having at least one recess portion in one surface thereof;
   a first wiring layer embedded in the one surface of the first insulating layer; and
   a first via layer including a first via penetrating through at least a portion of the first insulating layer, one surface of the first via being exposed externally from a lower surface of the recess portion,
   wherein the first via layer further includes a second via penetrating through at least a portion of the first insulating layer and tapered in a direction opposite to that of the first via.

2. The printed circuit board of claim 1, further comprising:
   a second wiring layer disposed on the other surface of the first insulating layer;
   a third insulating layer disposed on the other surface of the first insulating layer to embed the second wiring layer in one surface thereof;
   a third wiring layer disposed on the other surface of the third insulating layer; and
   a second via layer penetrating through at least a portion of the third insulating layer and electrically connecting the second and third wiring layers to each other,
   wherein at least one of a line width, a pitch, or a spacing in each of the second and third wiring layers is larger than that in the first wiring layer.

3. The printed circuit board of claim 2, further comprising:
   a fourth wiring layer disposed to protrude from the one surface of the first insulating layer,
   wherein the second via electrically connects the second and fourth wiring layers to each other.

4. The printed circuit board of claim 3, further comprising:
   a first passivation layer disposed on the one surface of the first insulating layer, and having a plurality of first openings at least partially exposing the first wiring layer, the recess portion, and the fourth wiring layer, respectively; and
   a second passivation layer disposed on the other surface of the third insulating layer, and having a plurality of second openings at least partially exposing the third wiring layer.

5. The printed circuit board of claim 4, further comprising first and second electrical connection metal bumps disposed in at least some of the plurality of first openings to be electrically connected to the first via and the fourth wiring layer, respectively.

6. The printed circuit board of claim 1, wherein the first wiring layer includes a first circuit pattern and a second circuit pattern, at least one of a line width, a pitch, or a spacing of the second circuit pattern being larger than that of the first circuit pattern.

7. The printed circuit board of claim 6, further comprising:
a second wiring layer disposed on the other surface of the first insulating layer,
wherein the first via layer further includes a second via penetrating through at least a portion of the first insulating layer and tapered in the same direction as the first via, and
the second via electrically connects the second wiring layer and the second circuit pattern to each other.

8. The printed circuit board of claim 7, wherein an area of the one surface of the first via is smaller than a cross-sectional area of the lower surface of the recess portion.

9. The printed circuit board of claim 1, wherein a height of the first via measured along a stacking direction is different from a height of the second via.

10. The printed circuit board of claim 8, wherein the second via directly contacts the second wiring layer and the second circuit pattern.

11. An electronic component package comprising:
a first substrate having first and second regions, and including a first insulating layer having a recess portion in one surface of the first region, and a first via layer including a first via penetrating through at least a portion of the first region, one surface of the first via being exposed externally from a lower surface of the recess portion;
an electronic component disposed on the first region of the first insulating layer; and
a second substrate disposed on one surface of the first substrate and the electronic component to be electrically connected to the first substrate.

12. The electronic component package of claim 11, wherein the first substrate further includes a first wiring layer disposed in one surface of the first insulating layer,
the electronic component package further comprises a first electrical connection metal disposed in the recess portion to electrically connect the first via and the electronic component to each other.

13. The electronic component package of claim 12, further comprising a second electrical connection metal disposed on the first wiring layer disposed in the second region of the first insulating layer to electrically connect the first wiring layer and the second substrate to each other.

14. The electronic component package of claim 13, wherein the first via layer further includes a second via penetrating through the second region of the first insulating layer and tapered in a direction opposite to that of the first via.

15. The electronic component package of claim 14, wherein the first wiring layer disposed in the first region of the first insulating layer is embedded from the one surface of the first insulating layer, and
the first wiring layer disposed in the second region of the first insulating layer protrudes from the one surface of the first insulating layer.

16. The electronic component package of claim 15, wherein the first substrate further includes a second wiring layer disposed on the other surface of the first insulating layer,
the first via is connected in contact with both the second wiring layer and the first electrical connection metal, and
the second via is connected in contact with both the second wiring layer and the first wiring layer disposed in the second region of the first insulating layer.

17. The electronic component package of claim 13, wherein at least one of a line width, a pitch, or a spacing in the first wiring layer disposed in the first region of the first insulating layer is smaller than that in the first wiring layer disposed in the second region of the first insulating layer.

18. The printed circuit board of claim 9, wherein the height of the first via is shorter than the height of the second via.

19. A printed circuit board comprising:
a first insulating layer having at least one recess portion in one surface thereof;
a first wiring layer embedded in the one surface of the first insulating layer; and
a first via layer including a first via penetrating through at least a portion of the first insulating layer, one surface of the first via being exposed externally from a lower surface of the recess portion,
wherein the first wiring layer includes a first circuit pattern and a second circuit pattern, at least one of a line width, a pitch, or a spacing of the second circuit pattern being larger than that of the first circuit pattern.

* * * * *